(12) United States Patent
Yeke Yazdandoost et al.

(10) Patent No.: US 10,838,556 B2
(45) Date of Patent: Nov. 17, 2020

(54) SENSING SYSTEM FOR DETECTION OF LIGHT INCIDENT TO A LIGHT EMITTING LAYER OF AN ELECTRONIC DEVICE DISPLAY

(71) Applicant: Apple Inc., Cupertino, CA (US)

(72) Inventors: Mohammad Yeke Yazdandoost, San Jose, CA (US); Lun Tsai, Zhubei (TW); Meng-Huan Ho, San Jose, CA (US); Niva A. Ran, Palo Alto, CA (US); Akshay Bhat, Milpitas, CA (US); Volodymyr Borshch, Cupertino, CA (US); Anand K. Chamakura, San Jose, CA (US); Giovanni Gozzini, Berkeley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/376,987

(22) Filed: Apr. 5, 2019

(65) Prior Publication Data

US 2020/0319731 A1 Oct. 8, 2020

(51) Int. Cl.
| | | |
|---|---|---|
| *G06F 3/042* | (2006.01) |
| *G09G 3/3225* | (2016.01) |
| *G06K 9/00* | (2006.01) |
| *H01L 27/28* | (2006.01) |
| *H01L 31/153* | (2006.01) |
| *H01L 31/173* | (2006.01) |
| *H01L 25/16* | (2006.01) |
| *H01L 27/32* | (2006.01) |
| *H01L 51/52* | (2006.01) |

(52) U.S. Cl.
CPC ......... *G06F 3/042* (2013.01); *G06K 9/0004* (2013.01); *G09G 3/3225* (2013.01); *H01L 25/165* (2013.01); *H01L 25/167* (2013.01); *H01L 27/288* (2013.01); *H01L 27/323* (2013.01); *H01L 27/3234* (2013.01); *H01L 27/3246* (2013.01); *H01L 27/3276* (2013.01); *H01L 31/153* (2013.01); *H01L 31/173* (2013.01); *H01L 51/524* (2013.01); *G09G 2320/0626* (2013.01); *G09G 2360/144* (2013.01)

(58) Field of Classification Search
CPC ....... G09G 2360/144; G09G 2360/148; G09G 2320/0626; G06F 3/042; G06K 9/0004
See application file for complete search history.

(56) References Cited

U.S. PATENT DOCUMENTS

| | | |
|---|---|---|
| 6,919,681 B2 | 7/2005 | Cok et al. |
| 6,946,647 B1 | 9/2005 | O'Neill et al. |
| 6,948,820 B2 | 9/2005 | Veligdan et al. |
| 7,499,094 B2 | 3/2009 | Kuriyama |

(Continued)

FOREIGN PATENT DOCUMENTS

| | | |
|---|---|---|
| CN | 107180853 | 9/2017 |
| EP | 3404484 | 11/2018 |

(Continued)

*Primary Examiner* — Michael Pervan
(74) *Attorney, Agent, or Firm* — Brownstein Hyatt Farber Schreck, LLP

(57) ABSTRACT

Systems and methods for detection of incident light are described. An optical imaging sensor is positioned at least partially within an active display area of a display and is configured to detect and characterize one or more properties of light incident to the active display area of the display.

22 Claims, 8 Drawing Sheets

(56) References Cited

U.S. PATENT DOCUMENTS

| | | | |
|---|---|---|---|
| 7,706,073 B2 | 4/2010 | Munro | |
| 8,305,400 B2 * | 11/2012 | Otani | G02F 1/1362 345/207 |
| 8,664,655 B2 | 3/2014 | Lee et al. | |
| 8,743,027 B2 | 6/2014 | Wu et al. | |
| 8,780,065 B2 | 7/2014 | Ribeiro et al. | |
| 9,007,349 B2 * | 4/2015 | Tseng | G06F 3/0325 178/19.05 |
| 9,112,043 B2 | 8/2015 | Arai | |
| 9,183,779 B2 * | 11/2015 | Soto | H05B 45/60 |
| 9,342,181 B2 | 5/2016 | Wyatt et al. | |
| 9,530,381 B1 * | 12/2016 | Bozarth | G09G 3/2003 |
| 9,614,168 B2 | 4/2017 | Zhang et al. | |
| 9,870,075 B2 | 1/2018 | Han et al. | |
| 10,079,001 B2 * | 9/2018 | Hodges | G09G 3/02 |
| 10,474,286 B2 | 11/2019 | Bae et al. | |
| 10,565,734 B2 | 2/2020 | Bevensee et al. | |
| 2003/0148391 A1 | 8/2003 | Salafsky | |
| 2012/0113357 A1 | 5/2012 | Cheng et al. | |
| 2015/0309385 A1 | 10/2015 | Shu et al. | |
| 2015/0348504 A1 * | 12/2015 | Sakariya | G09G 3/3233 345/206 |
| 2015/0364107 A1 * | 12/2015 | Sakariya | G06F 3/0412 345/174 |
| 2017/0270342 A1 | 9/2017 | He et al. | |
| 2018/0032778 A1 | 2/2018 | Lang | |
| 2019/0034686 A1 | 1/2019 | Ling et al. | |
| 2019/0221624 A1 | 7/2019 | Lin et al. | |
| 2020/0209729 A1 | 7/2020 | Chen et al. | |

FOREIGN PATENT DOCUMENTS

| | | |
|---|---|---|
| WO | WO 17/204777 | 11/2017 |
| WO | WO 18/210317 | 11/2018 |

* cited by examiner

SENSING SYSTEM FOR DETECTION OF LIGHT INCIDENT TO A LIGHT EMITTING LAYER OF AN ELECTRONIC DEVICE DISPLAY

FIELD

Embodiments described herein relate to electronic device displays and, in particular, to display stack constructions for detection of light incident to a light emitting layer of the display stack.

BACKGROUND

An electronic device can include a display formed from a stack of functional and structural layers (a "display stack") attached to, or otherwise disposed below, a protective outer cover. In many conventional implementations, the protective outer cover defines an exterior surface of a housing of the electronic device.

An electronic device can also include a light sensing system, such as an ambient light sensor. Typically, a light sensing system is positioned below the protective outer cover, adjacent to, and separated from, a light emitting region of the display stack. As a result, a conventional electronic device incorporating both a display and a light sensing system typically requires a large-area protective outer cover that extends beyond a periphery of the display stack to reserve space to accommodate the light sensing system. This conventional construction undesirably increases the apparent size of a bezel region circumscribing the display, while also undesirably increasing the size and volume of the housing of the electronic device.

SUMMARY

Embodiments described herein relate to a display for an electronic device that includes a light sensing system configured to detect light incident to a light emitting layer of the display. In particular, light sensors associated with the light sensing system can be distributed around or within an active display area of the display. As a result of this construction, the light sensing system can assemble an image of an object touching the display or, additionally or alternatively, can serve as an ambient light sensor for an electronic device incorporating the display.

One embodiment described herein may take the form of an electronic device comprising: a housing; a protective outer cover attached to the housing; a display disposed below the protective outer cover and comprising: a set of pixels defining a light emitting layer of an active display area; and a light sensing system disposed below the protective outer cover and comprising: a light sensor formed onto the light emitting layer, among the set of pixels, and configured to receive light incident to the light emitting layer and that is not emitted by the light emitting layer.

Another sample embodiment described herein may take the form of a display for an electronic device comprising: a light emitting layer defining an active display area, the light emitting layer comprising: an arrangement of pixels; and an array of light sensors coupled to a light sensing system for the electronic device and configured to receive light incident to the light emitting layer; wherein: the array of light sensors is situated among the arrangement of pixels.

Still another embodiment takes the form of a method of operating a light sensing system defined on a light emitting layer of a display stack of an electronic device, the method comprising: detecting, using the display stack, a touch input provided by a user to a surface above the display stack; receiving one or more signals from one or more light sensors of the light sensing system that are separated from the touch input; and determining a magnitude of ambient light incident to the display stack and not below the touch input based on the received one or more signals.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1:
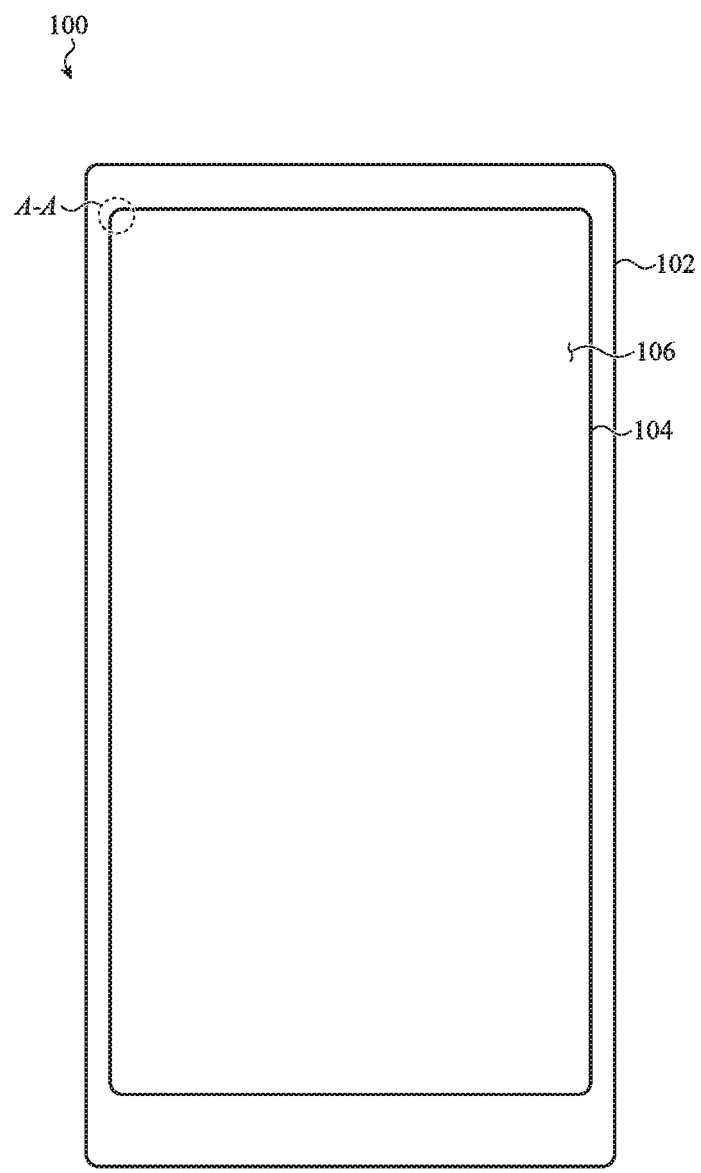
FIG. 1 depicts an electronic device that can incorporate a display stack suitable for detection of incident light.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein include a light sensing system including an array of photodetectors (e.g., photodiodes and/or solar cells) integrated into inter-pixel regions and/or perimeter regions of a pixel define layer of an organic light emitting diode display incorporated into an electronic device. In other implementations, a light sensing system—such as described herein—can include an array of photodiodes and/or solar cells integrated into inter-pixel regions or perimeter regions of a micro light-emitting diode display incorporated into an electronic device. The array of photodiodes and/or solar cells can be communicably and/or conductively coupled to a controller configured to obtain electrical signals (e.g., voltage signals, current signals, changes in resistance, and so on) from one or more of the photodiodes and/or solar cells in order to sense a color and/or intensity of light incident to the display stack.

In many embodiments, the light sensing system is used as an ambient light sensor, but this is merely one example and in other implementations the light sensing system can be suitably configured to be used as, or with: an optical imaging system (e.g. camera, light field sensor, depth sensor, fingerprint imaging sensor, iris or retina imaging system, and so on); a touch input sensor; a force input sensor; a biometric measurement system (e.g., photoplethysmogram sensor, blood oxygenation sensor, respiration sensor, and so on); and so on.

For simplicity of description, the embodiments that follow reference a light sensing system configured for use as an ambient light sensor by an electronic device incorporating an organic light emitting diode display. It is appreciated, however, that this construction is merely one example and that the various constructions and architectures described herein can be suitably configured for use with other display technologies and, likewise, with other optical sensing or light detection, collection, or imaging systems (e.g., biometric imaging systems).

More generally, embodiments described herein reference an electronic device with a display defined, at least in part, by a display stack including a light emitting layer (e.g., a pixel define layer) that defines an "active display area" of the display. The electronic device further includes a light sensing system that is embodied, at least in part, by an array of photodiodes or light sensors disposed on the light emitting layer. Each photodiode of the array of photodiodes is formed from a material, and/or into a structure, that generates an electrical current or accumulates an electrical charge in response to incident light striking a photosensitive area of each respective photodiode.

The photodiodes can be configured to be sensitive to infrared light, visible light, and/or light within a particular band of light (e.g., a particular color or range of colors of light). In different implementations, different photodiodes of the array of photodiodes can be configured to be sensitive to different bands of light. For example, in one embodiment, a first subset or subgroup of the array of photodiodes can be configured to be sensitive to infrared light, whereas a second subset or subgroup of the array of photodiodes can be configured to be sensitive to light of a particular color.

The photodiodes of the array of photodiodes can be disposed in any suitable pattern. For example, the array of photodiodes can be disposed along a portion or entirety of a perimeter of the active display area of the light emitting layer. In other cases, the array of photodiodes can be disposed within regions between pixels or subpixels (referred to herein as "inter-pixel regions") of the active display area. In many cases, the array of photodiodes can formed in the same process as the light emitting layer, but this may not be required of all embodiments.

A light sensing system, such as described herein, further includes a controller (or more than one controller communicably coupled in a suitable manner such as, for example, a master-slave configuration or hub-spoke configuration) communicably or conductively coupled to one or more photodiodes of the array of photodiodes. In some examples, the controller can be coupled to more than one photodiode such that electrical charge and/or current generated or accumulated by each photodiodes may be binned, combined, or otherwise aggregated into a single electrical measurement that corresponds to one or more characteristics of light incident to the display stack.

The electrical measurement(s) corresponding to light received by the controller(s) of the light sensing system can be used for any suitable purpose such as, but not limited to: enabling or disabling the display; enabling or disabling an input sensor, such as a touch input sensor or a force input sensor; enabling or disabling a system or subsystem of the electronic device; changing a power state of the electronic device; assembling an image of an object touching the display (e.g., fingerprint, stylus tip, and so on); determining a location and/or area of one or more objects touching or hovering over the display; and so on.

These foregoing and other embodiments are discussed below with reference to FIGS. 1-8. However, those skilled in the art will readily appreciate that the detailed description given herein with respect to these figures is for explanatory purposes only and should not be construed as limiting.

FIG. 1 depicts an electronic device 100, including a housing 102 that encloses a display stack defining a display that incorporates a light sensing system, such as described herein. The electronic device 100 is depicted as a cellular phone or handheld tablet computer, but this is not required of all embodiments. Other example electronic devices or electronic device types that can include a housing that encloses a display stack defining a display include but are not limited to: personal electronic devices; laptop computers; desktop computers; peripheral input devices; health monitoring devices; smart watch devices; worn devices; vehicle or aeronautical control or interface devices; industrial control devices; and so on.

The display stack enclosed in the housing 102 of the electronic device 100 can include layers or elements such as, and in no particular order: a touch input layer; a force input layer; an anode layer; a cathode layer; an organic layer; an encapsulation layer; a reflector layer; a stiffening layer; an injection layer; a transport layer; a polarizer layer; an anti-reflective layer; a liquid crystal layer; a backlight layer; one or more adhesive layers; a compressible layer; an ink layer; a mask layer; and so on.

For simplicity of description, the embodiments that follow reference an organic light emitting diode display stack including, among other layers: a reflective backing layer; a thin-film transistor layer; an encapsulation layer; and an emitting layer also referred to as a pixel define layer. It is appreciated, however, that this is merely one example implementation and that other displays and display stacks can be implemented with other display technologies, or combinations thereof. Example alternative display technologies include, but are not limited to: micro light-emitting diode (Micro LED) displays; liquid crystal displays (LCDs); quantum dot displays; and so on.

The display stack enclosed in the housing 102 of the electronic device 100 is characterized by an active display area 104 positioned below an outer protective layer 106 formed from a transparent material such as glass or plastic.

The active display area 104 is characterized by an arrangement of individually-controllable, physically-separated, and addressable pixels (or subpixels) distributed at a constant or variable pitch to defined one or more pixel densities in one or more distribution patterns. For simplicity of description, the term "pixel" as used herein is understood to refer to an individually controllable light-emitting or light-transmissive area of a display. The active display area 104 of display of the electronic device 100 is typically circumscribed by an opaque portion of the housing 102 and/or the outer protective layer 106 typically referred to as a bezel. The bezel can have a consistent or varying thickness around the periphery of the active display area 104.

The display stack also typically includes an input sensor, such as a force input sensor and/or a touch input sensor, to detect one or more characteristics of a user's physical interaction with the active display area 104 of the display of the electronic device 100 when that user touches the outer protective layer 106 of the electronic device 100 with the user's finger or with an object. Example user input characteristics that can be detected by an input sensor of the electronic device 100 include, but are not limited to: touch location; force input location; touch gesture path, length, duration, and/or shape; force gesture path, length, duration, and/or shape; magnitude of force input; number of simultaneous force inputs; number of simultaneous touch inputs; and so on. As a result of these constructions, a user of the electronic device 100 is encouraged to interact with content shown or rendered by the active display area 104 of the display by physically touching and/or applying a force with the user's finger—or another object, such as a stylus—to the outer protective layer 106 above the active display area 104.

As with other embodiments described herein, the display stack defining the active display area 104 additionally includes a light sensing system that is configured to facilitate detection of incident light. The light sensing system is disposed on, and/or at least partially defined on, one or more layers of the display stack. In this manner, the light sensing system is integrated into the display stack and can be manufactured using identical or similar processes employed to manufacture the display stack itself.

The light sensing system includes an array of individual light sensors (see, e.g., FIGS. 2-4) that are conductively and/or communicably coupled, via a signal routing structure such as an electrical trace or an interposer, to an electrical circuit referred to herein as a "controller."

The controller of the light sensing system of the electronic device 100 typically includes a processor, digital circuit, analog circuit or combination thereof and is configured to obtain an electrical measurement from one or more of the individual light sensors of the light sensing system. The controller can further include and/or can be coupled to, without limitation, one or more: amplifiers; voltage or current supplies; multiplexers; de-multiplexers; and so on. In some examples, the controller can be implemented in whole or in part by software executed by a processor of the electronic device 100 enclosed in the housing 102.

The individual light sensors of the light sensing system coupled to the controller are disposed or formed directly onto one or more layers of the display stack that defines the active display area 104. More specifically, in some embodiments, the individual light sensors are disposed in inter-pixel regions of the active display area 104. In some embodiments, the individual light sensors of the light sensing system are disposed additionally or alternatively along a perimeter of the active display area, adjacent to pixels that define the active display area 104.

The individual light sensors of the light sensing system can be disposed across the entire display, but this may not be required. For example, in some embodiments, the light sensing system can include multiple groups of individual light sensors disposed in different portions of the active display area 104 (see, e.g., FIG. 5). In one specific example, a light sensing system includes four separate groups of individual light sensors, each group disposed relative to a corner (or corner region) of the active display area 104. As a result of this construction, the light sensing system may be able to detect light incident to the active display area 104 even if one or more of the groups of individual light sensors is occluded or covered by a user.

In many cases, the individual light sensors of the light sensing system are disposed at approximately the same pitch as the pixels of the active display area 104, but this may not be required. For example, in some cases, a group of individual light sensors may be disposed in a rectilinear grid having a pitch greater than the pitch of the pixels of the active display area 104.

In many cases, the individual light sensors of the light sensing system have a geometric surface area that is approximately equal to a the light-emissive surface area of an adjacent pixel, but this may not be required. For example, in some cases, individual light sensors have a smaller geometric surface area and/or a different shape, than adjacent pixels.

In many embodiments, each individual light sensor of the light sensing system is formed in the same process, to the same shape, and of the same materials although this is not required of all embodiments. In some embodiments, certain light sensors of the light sensing system may be sensitive to different light than other light sensors of the light sensing system. For example, some light sensors of the light sensing system may be sensitive to green light, whereas other light sensors of the light sensing system may be sensitive to red light. In some cases, certain light sensors of the light sensing system can be sensitive to infrared or ultraviolet light.

As noted above, the individual light sensors of the light sensing system can be communicably and/or conductively coupled to the controller in any suitable manner. In some examples, the individual light sensors can be conductively coupled to the controller via one or more electrical traces formed on a thin film transistor layer of the display stack that defines the active display area 104. In another, non-limiting, phrasing, in some embodiments the individual light sensors leverage the same thin-film transistor layer used by the pixels of the active display area 104. In other embodiments, the individual light sensors of the light sensing system may have control and/or drive signals routed thereto, and/or sense or output signals routed therefrom, in any other suitable manner.

In some implementations, more than one individual light sensor can be conductively coupled together in a single circuit that, in turn, is conductively and/or communicably coupled to the controller. In these examples, the individual light sensors can be coupled in series or in parallel and it may be appreciated that different implementations may benefit from different constructions.

In one example configuration, each light sensor of the light sensing system is a photodiode, such as an organic photodiode, that generates an electrical current when exposed to light. In this example, the controller can be configured to measure electrical current generated by one or more light sensors of the light sensing system. The electrical measurements and/or other value(s) derived therefrom can be correlated to one or more values that correspond to a property of light incident to the active display area 104. In this manner, the light sensing system can be used by the electronic device 100 to perform one or more actions in response to changes in light incident to the active display area 104. In at least the case of a Micro LED display, the light sensor may include a silicon photodetector.

Example electrical measurements that can be taken or otherwise obtained by a controller, such as described herein, include, but are not limited to: instant current; change in current in a given time period; instant voltage between two nodes; change in voltage across two nodes in a given time period; and so on.

Example properties of light that can be correlated to electrical measurements taken or otherwise obtained by a controller, such as described herein, include, but are not limited to: brightness; illuminance; color; rate of change of brightness or illuminance; rate of change of change of color; and so on.

Example actions that can be performed by the electronic device 100 in response to changes in light received by the light sensing system include but are not limited to: changing an operating condition or setting a subsystem of the electronic device 100 (e.g., a display, a haptic output element, a speaker, a microphone, and so on); changing a power state of the electronic device 100; launching or terminating a software application or system-level or kernel-level service executed by a processor of the electronic device 100; processing a user input at a particular location of the active display area 104; and so on.

It may be appreciated that the preceding examples are not exhaustive and that in other implementations, other constructions, and other architectures an electronic device—such as the electronic device 100—can be suitably configured with a light sensing system and can leverage output from that light sensing system for any suitable purpose.

For example, in some embodiments, a light sensing system incorporated into a display stack of an electronic device, such as described herein, can be configured to generate an image of an object in contact with an outer surface of the electronic device above the active display area of the display and, in turn, above the light sensing system. In this manner, the light sensing system can be used to obtain an image of a fingerprint of a user touching the display. In other cases, the light sensing system can be used to obtain an image of another object in contact with the display. Examples include: obtaining an image of a document laid on the display; obtaining an image of a palm, or vein pattern, of a user touching the display; obtaining an image of a stylus tip touching the display; obtaining a visible-spectrum, infrared, or ultraviolet image of a currency node laid on the display; and so on. In these and other embodiments, individual light sensors of the light sensing system may be positioned below or relative to passive or active optical structures such as lenses, reflectors, shutters, or color filters.

In some embodiments, the light sensing system incorporated into the display stack of the electronic device 100 can be configured for ambient light detection (e.g., as an ambient light detection system). In these examples, the electronic device 100 can leverage output from the light sensing system to determine when to: disable or enable a display; increase or decrease speaker volume; change audio output from an earpiece speaker to a loudspeaker; and so on.

In some embodiments, the electronic device 100 is configured to leverage output from the light sensing system to improve the functionality, responsiveness, or operation of another system or subsystem of the electronic device. For example, the electronic device 100 can leverage output from the light sensing system as a touch input sensor redundant to a capacitive touch input system. As a result of this construction, the electronic device 100 can detect multi-touch user input when the capacitive touch input system does not detect user input (e.g., when a user wears gloves).

It may be appreciated that the foregoing description of FIG. 1, and the various alternatives thereof and variations thereto, are presented, generally, for purposes of explanation, and to facilitate a thorough understanding of various possible configurations of an electronic device incorporating a display stack suitable for detection of incident light, such as described herein. However, it will be apparent to one skilled in the art that some of the specific details presented herein may not be required in order to practice a particular described embodiment, or an equivalent thereof.

Further, although the electronic device 100 includes only a single rectangular display, it may be appreciated that this example is not exhaustive. In other embodiments, an electronic device can include, or may be communicably coupled to, multiple displays, one or more of which may be suitable for detection of incident light. Such accessory/auxiliary displays can include, but may not be limited to: secondary monitors; function row or keyboard key displays; wearable electronic device displays; peripheral input devices (e.g., trackpads, mice, keyboards, and so on) incorporating displays; digital wallet screens; and so on. Similarly, a rectangular display may not be required; other embodiments are implemented with displays taking other shapes, including three-dimensional shapes (e.g., curved displays, foldable displays, and so on).

Accordingly, generally and broadly in view of FIG. 1, it is understood that an electronic device including a display suitable for detection of incident light can be configured in a number of ways. For example, although the electronic device 100 is depicted as a cellular phone, it may be appreciated that other electronic devices can incorporate a display stack such as described herein including, but not limited to: tablet devices; laptop devices; desktop computers; computing accessories; peripheral input devices; vehicle control devices; mobile entertainment devices; augmented reality devices; virtual reality devices; industrial control devices; digital wallet devices; home security devices; business security devices; wearable devices; health devices; implantable devices; clothing devices; fashion accessory devices; and so on.

Further it is appreciated that beyond the components depicted in FIG. 1, the electronic device 100 can also include one or more processors, memory, power supplies and/or batteries, network connections, sensors, input/output ports, acoustic elements, haptic elements, digital and/or analog circuits for performing, supervising, and/or coordinating one or more tasks of the electronic device 100 or the light sensing system incorporated into the display thereof, and so on. For simplicity of illustration, the electronic device 100 is depicted in FIG. 1 without many of these elements, each of which may be included, partially and/or entirely, within the housing 102 and may be operationally or functionally associated with, or coupled to, the display of the electronic device 100.

Similarly, although the display described in reference to the electronic device 100 is a primary display of an electronic device, it is appreciated that this example is not exhaustive. In some embodiments, a display stack can define an auxiliary display, such as a monochromatic display or a greyscale display.

In other cases, a display stack can define a single-image display, such as a glyph or icon. In one specific example, a power button for an electronic device can include a button cap incorporating a display such as described herein. The display can be configured to selectively display a power icon and/or a limited set of icons or glyphs associated with one or more functions the button may be configured to perform, or one or more configurable options the button is associated with (e.g., power options, standby options, volume options, authentication options, digital purchase options, user authentication options, and so on). In these examples, a limited-purpose, auxiliary, or secondary display can be configured to have partial transparency or translucency, such as described herein, to facilitate detection of incident light.

Thus, it is understood that the foregoing descriptions of specific embodiments are presented for the purposes of illustration and description. These descriptions are not exhaustive nor intended to limit the disclosure to the precise forms recited herein. To the contrary, it will be apparent to one of ordinary skill in the art that many modifications and variations are possible in view of the above teachings.

Figure 2:
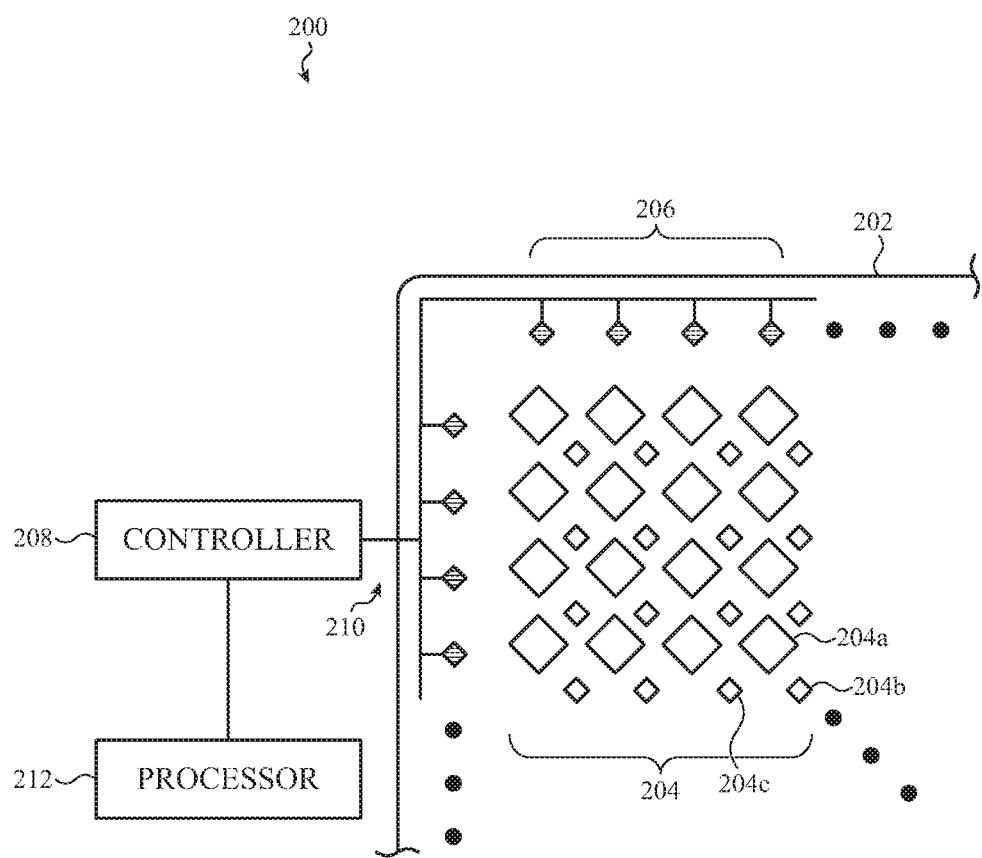
FIG. 2 depicts an example arrangement of pixels of a display stack incorporating a light sensing system, such as described herein.

Particularly, it is understood that a display stack suitable for detection of incident light can be constructed and/or assembled in many suitable ways. For example, FIG. 2 depicts an example arrangement of pixels of a display stack incorporating a light sensing system, such as described herein. As with other embodiments described herein, the light sensing system is configured to receive and/or otherwise detect one or more characteristics of light incident to a light emitting layer of the display stack depicted in FIG. 2. Output from the light sensing system (e.g., electrical signals generated by the light sensing system) can be routed through the light emitting layer and/or a thin film transistor layer of the display stack and can be correlated by a processor or controller to quantities that correspond to characteristics of light incident to the display stack.

More specifically, FIG. 2 depicts a simplified plan view of a display stack 200 including a light emitting layer 202 that includes an arrangement of pixels 204, three of which are identified as the pixels 204a, 204b, and 204c. The pixels 204a, 204b, and 204c can be operated together as subpixels of a single pixel; the pixels 204a, 204b, and 204c can each be configured to emit a different band of light. In one example, the pixel 204a is configured to emit blue light, the pixel 204b is configured to emit green light, and the pixel 204c is configured to emit blue light. It may be appreciated that the regular and repeating geometric arrangement and color(s) emitted by the various pixels of the arrangement of pixels 204 is merely one example; in other embodiments other pixel arrangements, pixel sizes or shapes, layouts, pitches (whether consistent or variable), patterns (whether repeating or otherwise), and so on are possible; any suitable arrangement of pixels can be selected for any implementation of any embodiment described herein, or an equivalent thereof.

The display stack 200 as shown in FIG. 2 may be a portion of the display stack described above in reference to FIG. 1, shown in the enclosed circle A-A.

The light emitting layer 202 can be a single or multi-layer substrate that can be formed in any suitable manufacturing process. In many cases, the light emitting layer 202 includes a rigid or flexible substrate that structurally supports each pixel in the arrangement of pixels 204. the light emitting layer 202 can further include or be coupled to one or more thin-film transistor layers that are communicably and/or conductively coupled to one or more of the pixels in the arrangement of pixels 204.

In typical constructions, the arrangement of pixels 204 defines an active display area of the display stack. For example, in some embodiments, the arrangement of pixels 204 is characterized by a number of individually-addressable and controllable light-emitting regions (e.g., light emitting diodes, organic light emitting didoes, and the like) that are disposed below color filters so as to define specific pixels associated with specific colors or bands of light. For example, a first light-emitting region may be positioned below a red color filter to define a red pixel, a second light-emitting region may be positioned below a blue color filter to define a blue pixel, and a third light-emitting region may be positioned below a green color filter to define a green pixel.

In other examples, light-emitting regions can be constructed in a manner that causes different light-emitting regions to emit light of different colors. For example, a first light-emitting region can be constructed or otherwise configured to emit red light, whereas a second light-emitting region can be constructed or otherwise configured to emit green light. It may be appreciated that these preceding examples are not exhaustive of the suitable types of light emission or transmission mechanisms that may be leveraged to form a display stack, such as described herein; any suitable means of producing, transmitting, reflecting, shaping, or guiding light to form a display can be used. Example technologies include, but are not limited to: organic light emitting diode display technology; micro light emitting diode (Micro LED) technology; liquid crystal display (LCD) technology; quantum dot display technology; electronic ink display technology; digital light processing technology; and the like.

As a result of these described and other equivalent constructions, differently-colored pixels separated at a particular pitch (e.g., immediately adjacent to one another) can be cooperatively controlled to produce light that, when observed from at least a minimum distance, appears to be a point source of light of a single color, hue, and saturation. In some embodiments, differently-colored adjacent pixels are individually referred to "subpixels" and collectively referred to as a single "pixel."

The arrangement of pixels 204 depicted in FIG. 2 shows a rectilinear repeating grid of generally square-shaped pixels. However, this is merely one example pixel distribution pattern. In other embodiments, other pixel distribution patterns may be used. Further, the arrangement of pixels 204 depicted in FIG. 2 shows different pixels of different sizes. However, this is merely one example. In other embodiments, other pixel size variations may be used.

As noted above, the display stack 200 also integrates a light sensing system. The light sensing system is disposed, in the depicted embodiment, at least partially along a perimeter of the arrangement of pixels 204. More specifically, an array of individual light sensors 206 is disposed onto the light emitting layer 202 in a manner that partially or entirely circumscribes the active display area of the display stack 200 defined by the arrangement of pixels 204.

The individual light sensors of the array of individual light sensors 206 can be formed in a number of suitable ways. In one embodiment, each light sensor is a photodiode formed onto the light emitting layer 202 that is configured to generate an electrical current when exposed to broad or narrow-spectrum visible light, ultraviolet light, and/or infrared light. In certain implementations of this example, each individual light sensor is an organic photodiode. In other examples, each light sensor is a solar cell (e.g., an organic solar cell, such as a polymer-organic solar cell or small molecular organic solar cell) that leverages the photovoltaic effect to generate current when exposed to light.

It may be appreciated that the foregoing examples are not exhaustive of the suitable types of light sensitive elements that can be disposed or formed onto the light emitting layer 202 of the display stack 200; any suitable structure, material, or combination thereof that exhibits an electrically measureable change in response to exposure to light can be used. Example technologies include, but are not limited to: photodiodes; photoresistors; solar cells; organic solar cells; and the like.

The individual light sensors of the array of individual light sensors 206 may be formed or disposed below optical filters. Example optical filters that may be used include, but are not limited to: color filters; polarization filters; diffusive filters; collimating filters; infrared cut or pass filters; ultraviolet cut or pass filters; visible light cut or pass filters; and so on. It may be appreciated that different light sensors of the array of individual light sensors 206 can be formed or disposed below different optical filters; a first light sensor may be formed or disposed below a red color filter whereas a second light sensors may be formed or disposed below a green color filter. In other embodiments, the individual light sensors of the array of individual light sensors 206 may be additionally or alternatively formed or disposed below one or more optical adapters, shutters, or lenses.

The array of individual light sensors 206 depicted in FIG. 2 shows a rectilinear repeating grid of generally square-shaped light sensors. However, this is merely one example distribution pattern. In other embodiments, other distribution patterns may be used. Further, the array of individual light sensors 206 depicted in FIG. 2 shows each light sensors having the same size and shape. However, this is merely one example. In other embodiments, different light sensors can be formed in different shapes and may have different sizes.

Each individual light sensor of the array of individual light sensors 206 is communicably and/or conductively coupled to a controller 208 via the signal paths 210. As noted with respect to other embodiments described herein, the signal paths 210 can include one or more of, without limitation: an interposer; a thin-film transistor layer; a circuit trace; a flexible circuit; a flex cable; and so on.

The controller 208 can include, without limitation: a digital circuit; an analog circuit; a processor; a memory; computer-executable code; an amplifier; a multiplexer; a de-multiplexer; a single processor; a high pass filter; a low pass filter; a band pass filter; an isolated power supply; and the like or any combination thereof.

As noted above, the controller 208 is configured to measure, determine, receive, or otherwise obtain an electrical signal from one or more light sensors of the array of individual light sensors 206. The electrical signal can be a voltage signal, a current signal, a change in resistance, a change in capacitance, a change in inductance, and so on. It may be appreciated that any suitable electrical property can be measured, approximated, quantified, or otherwise obtained by the controller 208. The controller 208 can be configured to receive a digital value, an analog signal, or a combination thereof. It may be appreciated that in different embodiments, the controller 208 may be configured or implemented in different ways.

The controller 208 in the illustrated embodiment is communicably and/or conductively coupled to a processor 212. The processor 212 may be a main or subordinate processor of an electronic device incorporating the display stack 200, such as the electronic device 100 depicted in FIG. 1.

In one embodiment, the processor 212 can be configured to receive a signal or data value from the controller 208 that can be correlated by the processor 212 to a property of incident light received by the light sensing system. For example, as noted above, the controller 208 may be configured to output a digital value corresponding to a current received by one or more light sensors of the array of individual light sensors 206. In these examples, the processor 212 can be configured to correlate that current (or change in current) to a brightness, luminance, color, or other property of light received by the light sensing system. In a general and broad, non-limiting phrasing, in some embodiments the processor 212 is configured to convert signals received from the controller 208 into values that correspond to one or more properties of light received by the light sensing system; the controller 208 in these embodiments is configure to output values that correspond directly or proportionately to electrical or physical parameters or properties of one or more light sensors of the array of individual light sensors 206.

In further embodiments, the controller 208 is configured to output to the processor 212 a value that corresponds to a property or characteristic of light received by the light sensing system. For example the controller 208 can be configured to output to the processor 212 a digital value—which may be communicated in any suitable form or format, whether encrypted or unencrypted—to the processor that corresponds to a color, a brightness, a hue, a saturation, or any other suitable property of light. In a general and broad, non-limiting phrasing, in some embodiments the controller 208 is configured to convert signals received from one or more light sensors of the array of individual light sensors 206 into values that correspond to one or more properties of light received by the light sensing system.

In some embodiments, two or more light sensor of the array of individual light sensors 206 may be conductively coupled together such that the controller 208 receives a measurement and/or electrical stimulus that results from an aggregation, summation, difference, or binning thereof. In these embodiments, the two or more light sensor of the array of individual light sensors 206 may be conductively coupled in parallel or series; different embodiments may be implemented in different ways.

In response to signals received from the controller 208—whether such signals correspond to electrical properties or light properties—the processor 212 can perform or initiate one or more actions, as noted above. For example, the processor 212 can be configured to, without limitation: assemble an image (e.g., fingerprint image, vein image, touch input image, document image, and so on) based on output from the one or more light sensor of the array of individual light sensors 206; determine an input area of a user's finger; increase a brightness of the display; decrease a brightness of the display; increase a volume output of a loudspeaker; decrease a volume output of a loudspeaker; increase volume output of an earpiece speaker; decrease a volume output of an earpiece speaker; adjust a haptic output parameter; and so on or any combination thereof.

It may be appreciated that the foregoing description of FIG. 2, and the various alternatives thereof and variations thereto, are presented, generally, for purposes of explanation, and to facilitate a thorough understanding of various possible configurations of a display stack that incorporates a light sensing system, such as described herein. However, it will be apparent to one skilled in the art that some of the specific details presented herein may not be required in order to practice a particular described embodiment, or an equivalent thereof.

For example, generally and broadly, it is appreciated that the controller 208 can be suitably configured to detect and/or quantify incident light from any one or more light sensor of the array of individual light sensors 206. The controller 208 can be configured to group two or more light sensors together to take a single measurement or can be configured to obtain measurements from each light sensor individually. As such, it is appreciated that light sensors of a display stack—such as the display stack 200—can be configured in any number of suitable ways.

Similarly, the processor 212 can be configured to perform any suitable action or sequence or series of actions in response to signals or data received from the controller 208.

Similarly, the various light sensors of the array of individual light sensors 206 can be configured in any suitable manner; some light sensors can be configured to detect changes in or brightness, hue, or saturation of a particular color of light whereas other light sensors can be configured to detect changes in intensity of infrared or ultraviolet light.

Similarly, it may be appreciated that the various light sensors of the array of individual light sensors 206 can be manufactured in any suitable manner (e.g., in the same process as used to manufacture the arrangement of pixels 204) using any number of suitable materials or combination of materials.

As such, generally and broadly, it may be appreciated that in view of the embodiment depicted and described in reference to FIG. 2, that a light sensing system can be disposed around a periphery of an active display area of a light emitting layer of a display stack in a number of suitable ways. Similarly, it may be appreciated that output(s) from such a system can be leveraged and/or otherwise used by an electronic device incorporating that display for a number of purposes. For example, output(s) from such a light sensing system disposed to circumscribe an active display area of a display can be used for, without limitation: determining ambient light magnitude; determining whether a user is gripping a device incorporating the light sensing system in a manner that obscures certain light sensors and does not obscure other light sensors; assembling an image of an object nearby the light sensing system; and the like and so on.

Thus, it is understood that the foregoing descriptions of specific embodiments are presented for the purposes of illustration and description. These descriptions are not exhaustive nor intended to limit the disclosure to the precise forms recited herein. To the contrary, it will be apparent to one of ordinary skill in the art that many modifications and variations are possible in view of the above teachings.

Figure 3:
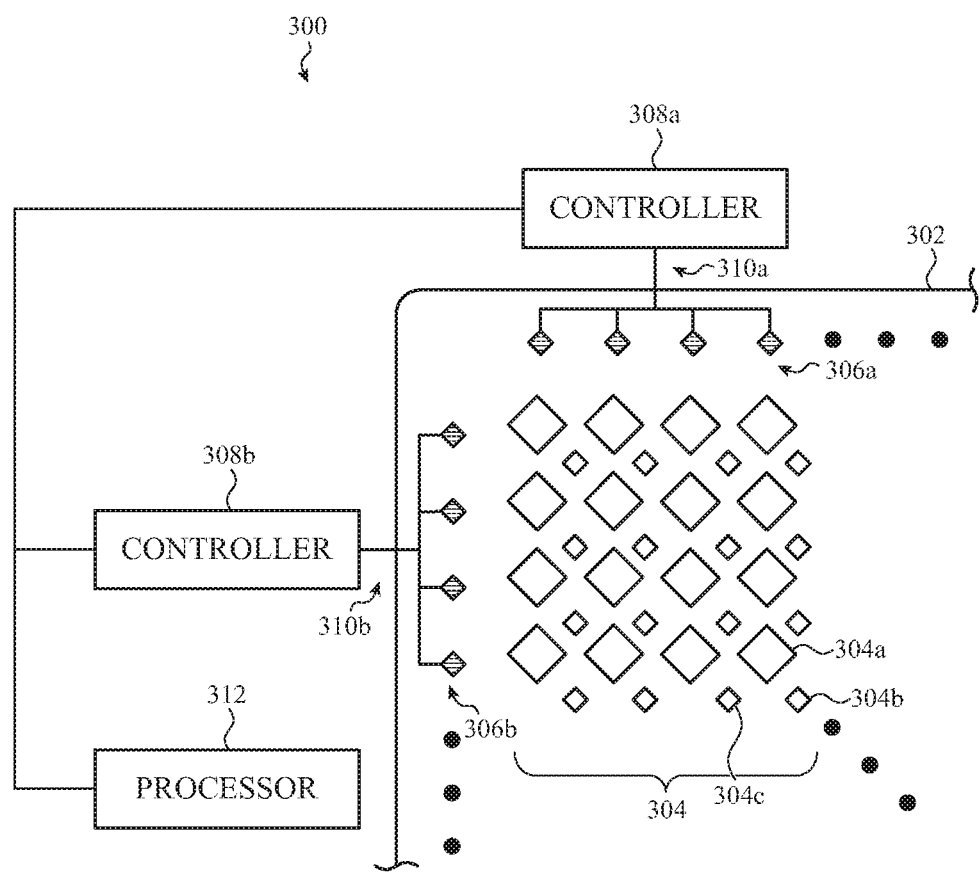
FIG. 3 depicts another example arrangement of pixels of a display stack incorporating a light sensing system, such as described herein.

For example, in some embodiments, more than one controller may be used. FIG. 3 depicts another example arrangement of pixels (identified as the arrangement of pixels 304, three of which are individually identified as the pixels 304a, 304b, and 304c) of a display stack 300 incorporating a light sensing system circumscribing a perimeter of an active display area of the display stack, such as described herein. The display stack 300 depicted in FIG. 3 can be configured in a similar manner as the display stack 200 described in reference to FIG. 2; this description is not repeated. As with FIG. 2, the display stack 300 as shown in FIG. 3 may be a portion of the display stack described above in reference to FIG. 1, shown in the enclosed circle A-A.

In contrast to the embodiment depicted in FIG. 2, the display stack 300 includes multiple dedicated controllers and multiple signal paths. More specifically, the display stack 300 includes a first and second group of light sensors 306a, 306b that are each communicably and/or conductively coupled to a respective dedicated controller, identified as the controllers 308a, 308b via a dedicated signal path 310a, 310b. In this examples, the controllers 308a, 308b are each communicably and/or conductively coupled to the processor 312.

In this embodiment, dedicated controllers are communicably coupled to a single processor in a manner that enables a construction in which the processor 312 can select which controller, among a set or group or array of controllers, from which to receive one or more outputs.

It may be appreciated that the foregoing description of FIG. 3, and the various alternatives thereof and variations thereto, are presented, generally, for purposes of explanation, and to facilitate a thorough understanding of various possible configurations of a display stack that incorporates a light sensing system, such as described herein. However, it will be apparent to one skilled in the art that some of the specific details presented herein may not be required in order to practice a particular described embodiment, or an equivalent thereof.

Figure 4:
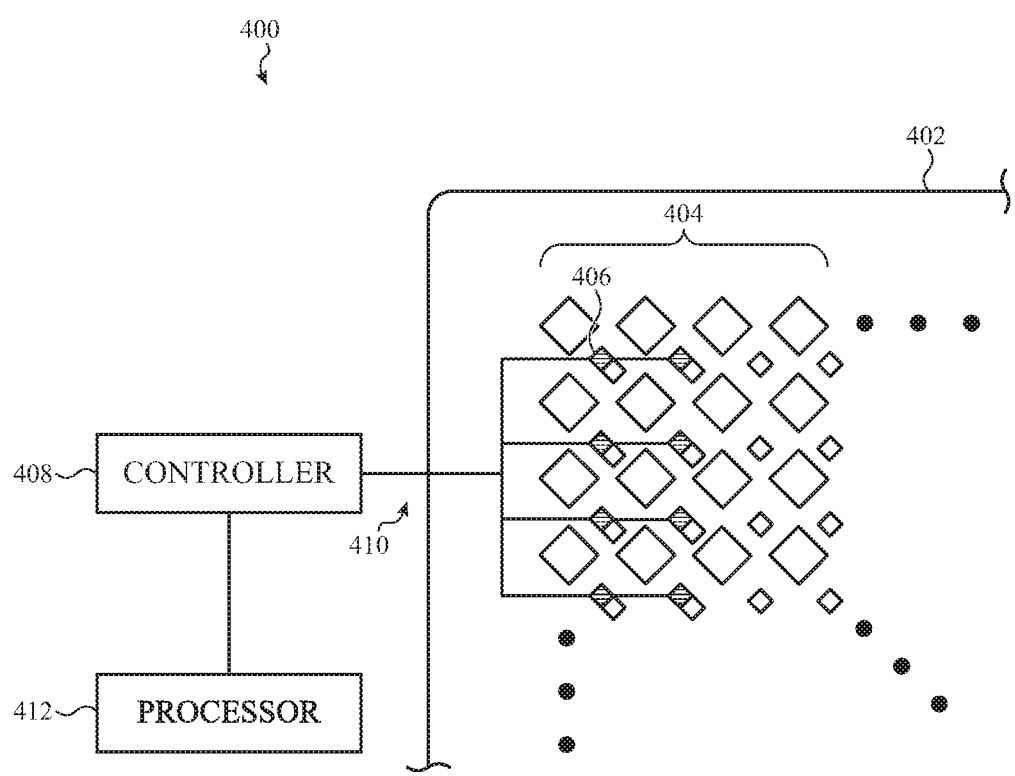
FIG. 4 depicts another example arrangement of pixels of a display stack incorporating a light sensing system, such as described herein.

For example, in some embodiments, a light sensing system can include light sensors disposed in inter-pixel regions of an active display area. FIG. 4 depicts another example arrangement of pixels of a display stack incorporating a light sensing system, such as described herein. As with FIG. 3, the display stack 400 depicted in FIG. 3 can be configured in a similar manner as the display stack 200 described in reference to FIGS. 2-3; this description is not repeated.

In contrast to FIGS. 2-3, the embodiment depicted in FIG. 4 shows a display stack 400 in which light sensors (one of which is identified as the light sensor 406) of the light sensing system are disposed among the pixels of the arrangement of pixels 404. In the illustrated embodiment, the various light sensors of the light sensing system are disposed next or adjacent to pixels of the arrangement of pixels 404.

It may be appreciated that the illustrated example is merely one possible configuration. For example, as shown, the light sensor 406 is disposed adjacent to a pixel of the arrangement of pixels 404 that emits a particular color (e.g., a red pixel, a blue pixel, a green pixel, and so on). In some cases, the light sensor 406 can be operated while the adjacent pixel is not emitting light, for example during an off cycle of a duty cycling of the adjacent pixel. In other cases, the light sensor 406 may be disposed a certain distance away from the nearest adjacent pixel. In still further examples, the light sensor 406 may be positioned adjacent to (or otherwise closest to, or abutting) only pixels of a specific type, shape or color. For example, in some implementations, the light sensor 406 can be positioned adjacent to red pixels only. In yet another example, the light sensor 406—and/or other light sensors of light sensing system—can be positioned adjacent or next to blue pixels only. It may be appreciated that the foregoing examples are not exhaustive and any suitable distribution of light sensors within inter-pixel regions of the arrangement of pixels 404.

In FIG. 4, the light sensors are disposed at approximately the same pitch as the pixels of the arrangement of pixels 404, but this may not be required. In some embodiments, the pitch of the light sensors may be a multiple of the pitch of the arrangement of pixels 404. In still other embodiments, the pitch of the light sensors may be entirely different from the pitch of the arrangement of pixels 404.

It may be appreciated that the foregoing description of FIG. 4, and the various alternatives thereof and variations thereto, are presented, generally, for purposes of explanation, and to facilitate a thorough understanding of various possible configurations of a display stack that incorporates a light sensing system, such as described herein. However, it will be apparent to one skilled in the art that some of the specific details presented herein may not be required in order to practice a particular described embodiment, or an equivalent thereof.

For example, it may be appreciated in view of the embodiments depicted in FIGS. 2-4 that a light sensing system can be incorporated into a display stack in any suitable pattern. For example, light sensors of a light sensing system can be disposed around a perimeter of an active display area (e.g., FIGS. 2-3), and/or light sensors of a light sensing system can be disposed within an active display area (e.g., FIG. 4).

As noted above, the various light sensors of a light sensing system of a system such as described herein can be disposed in any suitable pattern within or around a periphery or circumference of an active display area and/or may be coupled to any suitable number of controllers that, in turn, can be communicably or conductively coupled to one or more processors. Similarly, light sensors of a light sensing system such as described herein can be: disposed in any suitable shape or size; disposed around a perimeter of an active display area; disposed within an active display area; configured to detect specific colors or bands of light (e.g., visible, infrared, ultraviolet); disposed in groups or patterns; coupled into a single circuit; or in any other suitable manner.

Thus, it is understood that the foregoing descriptions of specific embodiments are presented for the purposes of illustration and description. These descriptions are not exhaustive nor intended to limit the disclosure to the precise forms recited herein. To the contrary, it will be apparent to one of ordinary skill in the art that many modifications and variations are possible in view of the above teachings.

Figure 5:
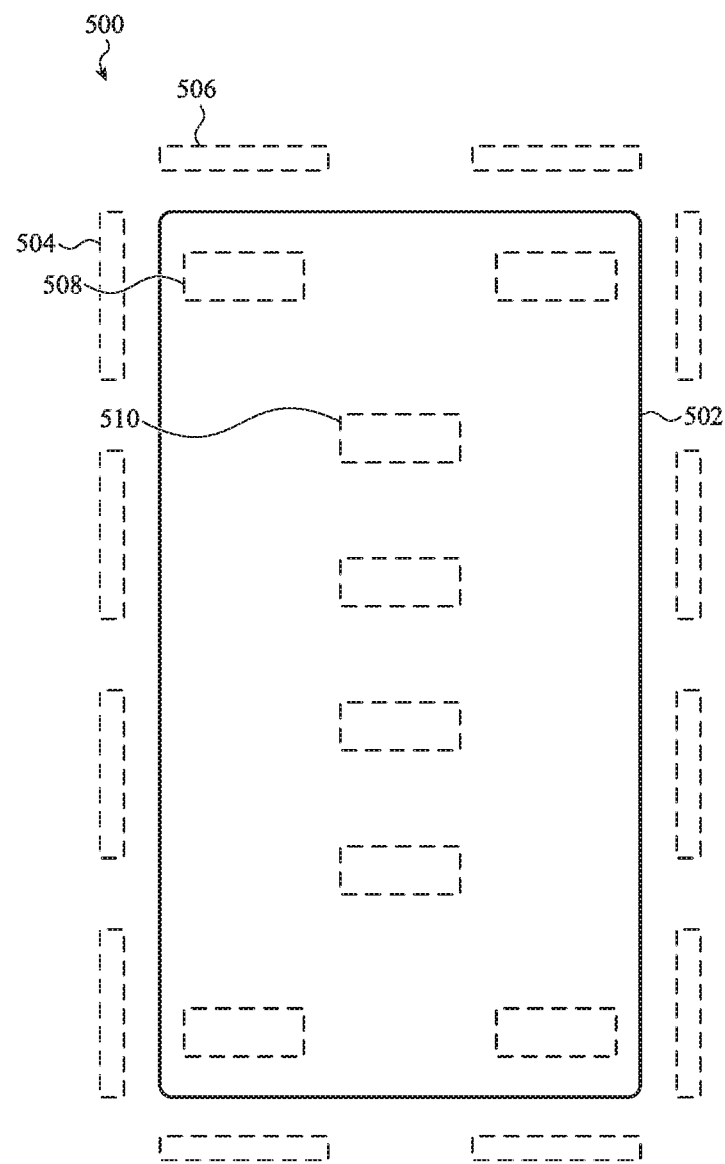
FIG. 5 depicts a simplified schematic view of a display stack that can incorporate a light sensing system for detection of incident light including multiple discrete light sensors.

For example, FIG. 5 depicts a simplified schematic view of a display stack 500 that can incorporate a light sensing system for detection of incident light including multiple discrete light sensors that may be operated cooperatively or independently. In particular, the display stack 500 includes a light emitting layer 502 that can additionally accommodate a light sensing system such as described herein. The light sensing system can include an array of light sensors that are grouped into discrete light sensors. The light sensors—each of which is associated with at least one discrete light sensor—can be disposed relative to any reference point of the light emitting layer 502. For example, a first group of light sensors 504 can be disposed onto the light emitting layer 502 relative to a perimeter or periphery of an active display area of the light emitting layer 502. Similarly, a second group of light sensors 506 can be disposed onto the light emitting layer 502 relative to the perimeter or periphery of the active display area of the light emitting layer 502. Additionally or alternatively, the light emitting layer 502 can accommodate light sensors within the active display area (see, e.g., FIG. 4), such as the groups of light sensors 508, 510.

It may be appreciated that the foregoing description of FIG. 5, and the various alternatives thereof and variations thereto, are presented, generally, for purposes of explanation, and to facilitate a thorough understanding of various possible configurations of a display stack that incorporates a light sensing system, such as described herein. However, it will be apparent to one skilled in the art that some of the specific details presented herein may not be required in order to practice a particular described embodiment, or an equivalent thereof.

For example, it may be appreciated that a light sensing system, such as described herein, can be disposed continuously or in discrete groups along a perimeter of or within an active display area of a display stack. These individual groups or contiguous areas of light sensors can be communicably or conductively coupled to a single controller (see, e.g., FIG. 2) or multiple controllers (see, e.g., FIG. 3). Similarly, the output from these controllers—which may be communicably and/or conductively coupled to one or more discrete groups of light sensors—can be used for any suitable purpose. Examples include: to change an operation of an electronic device (e.g., change audio volume, switch audio output, change display brightness, change a power state of a system or subsystem, and the like); to perform an operation (e.g., obtaining a biometric image, obtaining an arbitrary image, and so on); to receive or otherwise process input from a user; and the like and so on.

In some examples, a light sensing system can be used in conjunction with another system or subsystem of an electronic device incorporating the light sensing system. For example, output(s) from a touch input system can inform an electronic device of which groups of light sensitive elements of the light sensing system are likely obscured by a user touching a display of that electronic device. In other examples, an electronic device can leverage output from a light sensing system to supplement or replace output from other systems or subsystems, such as touch input systems.

Thus, it is understood that the foregoing descriptions of specific embodiments are presented for the purposes of illustration and description. These descriptions are not exhaustive nor intended to limit the disclosure to the precise forms recited herein. To the contrary, it will be apparent to one of ordinary skill in the art that many modifications and variations are possible in view of the above teachings.

Figure 6:
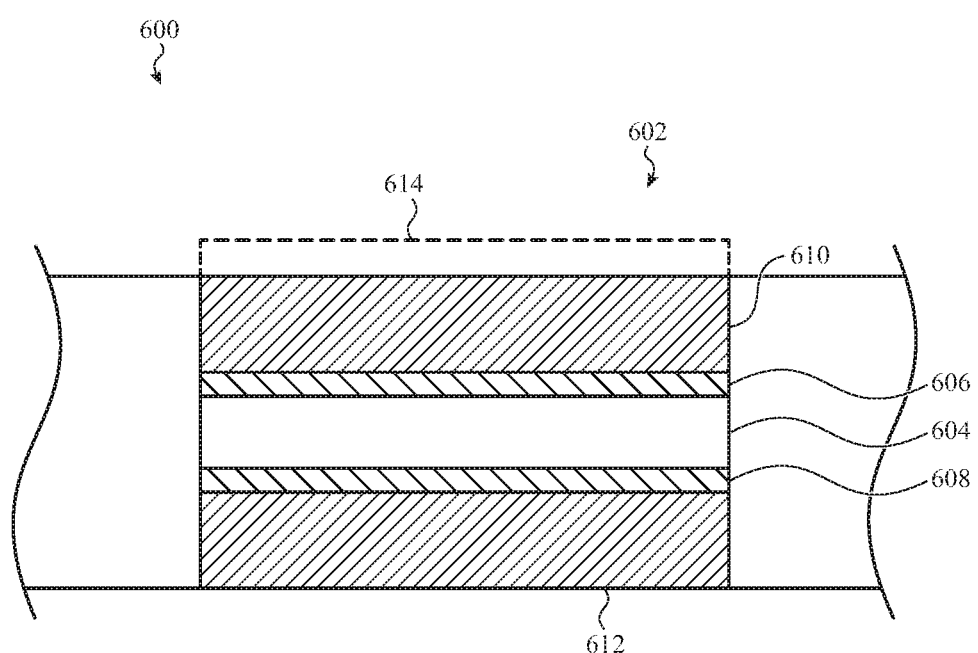
FIG. 6 depicts an example simplified cross-section of a display stack incorporating a light sensing system, such as described herein.

For example, as noted above, it may be appreciated that a light sensor of a light sensing system can be formed in number of suitable ways. FIG. 6 depicts a cross section of an example light sensor, such as described herein. For example, the light sensor 600 can be implemented as an organic solar cell 602. The organic solar cell 602 can include a thin-film solar cell, a polymer organic solar cell layer, or a small molecular solar cell layer—identified as the solar cell layer 604, that is sandwiched between an electron transport layer 606 and a hole transport layer 608. The electron transport layer 606 and the hole transport layer 608 are disposed between a cathode layer 610 and an anode layer 612, respectively. In some embodiments, the light sensor 600 can be formed and/or disposed in plane with a pixel define layer of an organic light emitting diode display (see, e.g., FIGS. 2-4).

It may be appreciated that the foregoing stack-up of layers is merely one example stack-up of layers that can form an organic solar cell that may be used as a light sensor, such as described herein. Output from the organic solar cell, such as electrical current, can be used as a means of generating electrical power (e.g., to trickle charge a battery), as a means of detecting incident light, as a means of detecting a specific color of light (e.g., positioned behind a filter), as a means of detecting polarized light (e.g., positioned behind a polarizer layer), and so on.

Further, it may be appreciated that the organic solar cell construction depicted above is only a single example of an organic solar cell. For example, in an alternative construction, the light sensor 600 can be implemented as a thin-film solar cell that includes an amorphous silicon layer 604 sandwiched between a p-type semiconductor layer 606 and an n-type semiconductor layer 608. These layers are, in turn, conductively coupled to two transparent conductor layers 610, 612.

Optionally, any suitable construction of the light sensor 600 can be disposed below the optical filter 614. The optical filter 614 can be, without limitation: an opaque film for dark-channel sampling; a color filter; a polarization filter; an electrically-controlled shutter (e.g., for dark channel sampling/subtraction); a lens; a beamforming optical adapter; and the like.

For example, in some examples, the optical filter 614 can be an opaque ink layer, such as may be used to provide an aesthetically-pleasing bezel region surrounding a display area, such as the display area depicted in FIG. 1. In these examples, output from a light sensor positioned below the opaque ink layer can be used to calibrate output from one or more light sensors positioned within or along an edge of an active display area of a display. In this manner, environmental changes (e.g., temperature, humidity, and so on) that may otherwise influence an output of a light sensor within the active display area can be calibrated based on output from the light sensor(s) positioned behind the opaque ink layer defining the bezel surrounding the active display area.

In other cases, the optical filter 614 can be a translucent or transparent portion of a bezel region surrounding an active display area. In this example, the optical filter 614 and the light sensor 600 can appear to a user as a dark region that aesthetically integrates with the bezel surrounding the active display area.

In still further examples, the optical filter 614 can be a controllable optical filter, such as a liquid crystal and polarizer filter. In other words, by applying an electrical signal to the optical filter 614, transparency or opacity of the optical filter 614 can be selectively controlled. In these examples, the controllable optical filter can be used to provide a dark channel reference for an optical measurement taken by the light sensor 600. More particularly, in these examples, a dark sample can be taken when the optical filter 614 is opaque and a light sample can be taken when the optical filter 614 is transparent. Thereafter, the dark sample data can be subtracted from the light sample to as a bias value.

In still further examples, the light sensor 600 can be positioned adjacent to and/or formed with one or more additional sensing circuits or property-sensitive structures include, but not limited to: temperature sensors; vibration sensors; pressure sensors; capacitive touch sensors; capacitive force sensors; and the like. In these examples, output from the additional sensing circuit can be used to correct and/or field-calibrate output(s) from the light sensors 600.

It may be appreciated that the foregoing description of FIG. 6, and the various alternatives thereof and variations thereto, are presented, generally, for purposes of explanation, and to facilitate a thorough understanding of various possible configurations of a light sensor of a light sensing system, such as described herein. However, it will be apparent to one skilled in the art that some of the specific details presented herein may not be required in order to practice a particular described embodiment, or an equivalent thereof.

Figure 7:
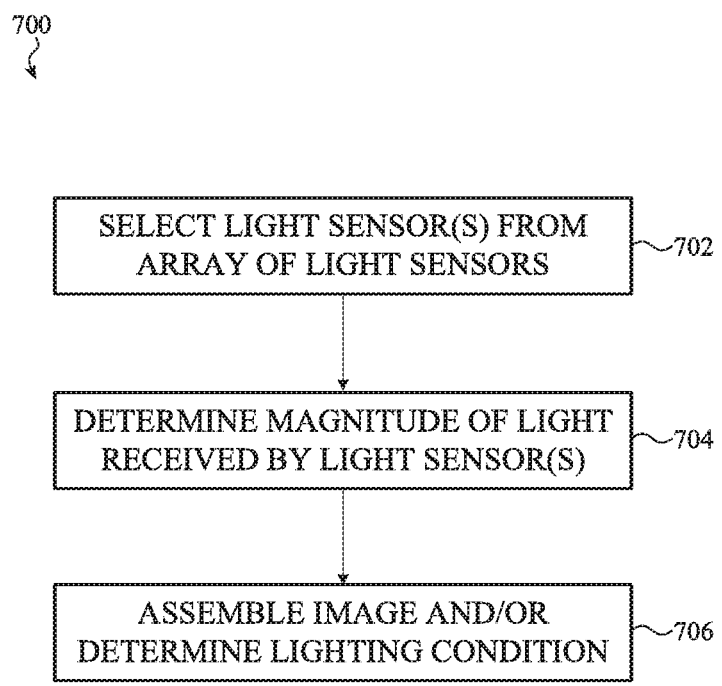
FIG. 7 is a simplified flow chart depicting example operations of a method of operating a light sensing system, such as described herein.
Figure 8:
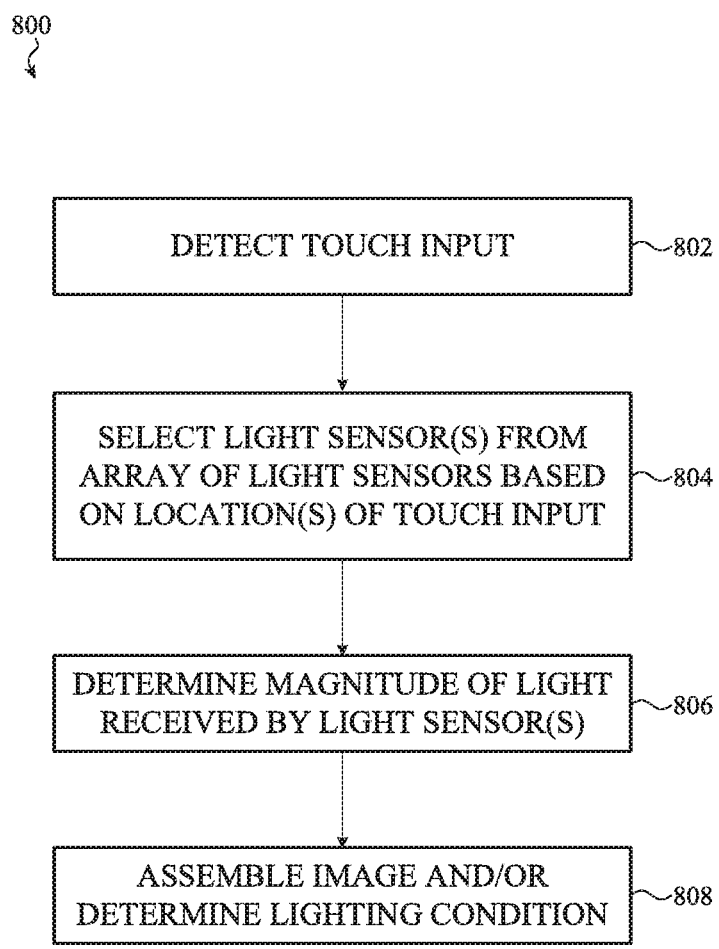
FIG. 8 is a simplified flow chart depicting example operations of a method of operating a light sensing system with a touch sensing system, such as described herein.

Generally and broadly, FIGS. 7 and 8 depict simplified flow charts corresponding to various ordered and/or unordered operations of methods described herein. It may be appreciated that these simplified examples may be modified in a variety of ways. In some examples, additional, alternative, or fewer operations than those depicted and described may be possible.

FIG. 7 is a simplified flow chart depicting example operations of a method of operating a light sensing system, such as described herein. The method can be performed in whole or in part by a controller or processor such as described in reference to FIGS. 1-4.

The method 700 includes operation 702 in which a light sensor or a set of light sensors is selected among a group or array of light sensors. After such a selection is made, the method 700 advances to operation 704 in which a magnitude of light received by the selected light sensors is determined. As noted above, such a determination can be made by a controller, such as described in reference to FIGS. 1-2. After a determination of the magnitude of light received by the selected sensors is made, the method 700 advances to operation 706 in which an image and/or a lighting condition is determined. An image may be an image of a fingerprint of a user touching a surface above the array of light sensors. A determination of a lighting condition may be a determination of whether a characteristic of light (e.g., brightness, hue, saturation, color, and so on) satisfies a particular threshold. It may be appreciated that any suitable determination may be made.

FIG. 8 is a simplified flow chart depicting example operations of a method of operating a light sensing system with a touch sensing system, such as described herein. As noted above, the method 800 may be performed in whole or in part by a controller or a processor such as described in reference to FIGS. 1-4.

The method 800 includes operation 802 in which a touch input is detect by a capacitive or other input sensor. Thereafter at operation 804, one or more light sensors from an array of light sensors may be selected based on the touch input. In some embodiments, light sensors adjacent to or below the touch input may be selected. In other embodiments, light sensors separated from the touch input may be selected.

The method 800 can continue to operation 806 in which a magnitude of light received by the selected light sensors can be obtained. Thereafter, at operation 808, after a determination of the magnitude of light received by the selected sensors is made, an image is assembled and/or a lighting condition is determined. As noted above, an image may be an image of a fingerprint of a user touching a surface above the array of light sensors. A determination of a lighting condition may be a determination of whether a characteristic of light (e.g., brightness, hue, saturation, color, and so on) satisfies a particular threshold. It may be appreciated that any suitable determination may be made.

One may appreciate that although many embodiments are disclosed above, that the operations and steps presented with respect to methods and techniques described herein are meant as exemplary and accordingly are not exhaustive. One may further appreciate that alternate step order or, fewer or additional operations, may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

Further, the present disclosure recognizes that personal information data, including biometric data, in the present technology, can be used to the benefit of users. For example, the use of biometric authentication data can be used for convenient access to device features without the use of passwords. In other examples, user biometric data is collected for providing users with feedback about their health or fitness levels. Further, other uses for personal information data, including biometric data, that benefit the user are also contemplated by the present disclosure.

The present disclosure further contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure, including the use of data encryption and security methods that meets or exceeds industry or government standards. For example, personal information from users should be collected for legitimate and reasonable uses of the entity and not shared or sold outside of those legitimate uses. Further, such collection should occur only after receiving the informed consent of the users. Additionally, such entities would take any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices.

Despite the foregoing, the present disclosure also contemplates embodiments in which users selectively block the use of, or access to, personal information data, including biometric data. That is, the present disclosure contemplates that hardware and/or software elements can be provided to prevent or block access to such personal information data. For example, in the case of biometric authentication methods, the present technology can be configured to allow users to optionally bypass biometric authentication steps by providing secure information such as passwords, personal identification numbers, touch gestures, or other authentication methods, alone or in combination, known to those of skill in the art. In another example, users can select to remove, disable, or restrict access to certain health-related applications collecting users' personal health or fitness data.

What is claimed is:

1. An electronic device comprising:
   a housing;
   a protective outer cover attached to the housing;
   a display disposed below the protective outer cover and comprising:
      a set of pixels defining a light emitting layer of an active display area enclosed by a bezel region; and
      a light sensing system disposed below the protective outer cover and comprising:
         an organic solar cell formed onto the light emitting layer, below the bezel region along a perimeter of the set of pixels, and configured to receive light incident to the light emitting layer.

2. The electronic device of claim 1, wherein the light sensing system further comprises a controller communicably coupled to the organic solar cell and configured to obtain an electrical signal from the organic solar cell that corresponds to the received light incident to the light emitting layer.

3. The electronic device of claim 2, wherein the controller is communicably coupled to a processor of the electronic device.

4. The electronic device of claim 3, wherein the processor uses data received from the controller to change a brightness of the display.

5. The electronic device of claim 3, wherein the light sensing system is an ambient light sensor.

6. The electronic device of claim 3, wherein the light sensing system is a biometric imaging system.

7. The electronic device of claim 6, wherein the biometric imaging system is configured to obtain an image of a fingerprint of a user touching the protective outer cover.

8. The electronic device of claim 1, wherein the display is a micro light emitting diode (Micro LED) display.

9. A display for an electronic device comprising:
   a light emitting layer defining an active display area bordered by a bezel, the light emitting layer comprising:
      an arrangement of pixels; and
      an array of light sensors disposed along a perimeter of the arrangement of pixels and at least partially below the bezel, the array of light sensors coupled to a light sensing system for the electronic device and configured to receive light incident to the light emitting layer; wherein:
   the array of light sensors is situated at last partially among the arrangement of pixels.

10. The display of claim 9, wherein the array of light sensors comprises a light sensor disposed at last partially below the bezel bordering the arrangement of pixels.

11. The display of claim 9, wherein the array of light sensors comprises a light sensor disposed in an inter-pixel region separating at least two pixels of the arrangement of pixels.

12. The display of claim 9,
    wherein the array of light sensors comprises a light sensor disposed between an edge of the arrangement of pixels and the bezel.

13. The display of claim 9,
    wherein the array of light sensors comprises a light sensor disposed below an opaque ink layer defining the bezel, at least in part.

14. The display of claim 9, wherein the array of light sensors comprises:
    a first subgroup of light sensors disposed within a first region of the active display area; and
    a second subgroup of light sensors disposed within a second region of the active display area.

15. The display of claim 14, wherein the first region is a central region of the active display area and the second region is a corner region of the active display area.

16. The display of claim 9, wherein the light emitting layer is a pixel define layer of an organic light emitting diode display.

17. The display of claim 9, wherein each light sensor of the array of light sensors is an organic photodetector.

18. The display of claim 9, wherein the array of light sensors is communicably coupled to a controller via one or more electrical traces defined on a thin-film transistor layer disposed below the light emitting layer.

19. A method of operating a light sensing system defined on a light emitting layer of a display stack of an electronic device, the method comprising:
    detecting, using the display stack, a touch input provided by a user to a surface above the display stack;
    receiving one or more signals from one or more selected light sensors of the light sensing system that disposed below a bezel region surrounding an active display area defined by the display stack, the one or more selected light sensors selected at least in part to maximize distance from the touch input; and determining a magnitude of ambient light incident to the display stack and not below the touch input based on the received one or more signals.

20. The method of claim 19, further comprising receiving one or more signals from one or more light sensors of the light sensing system that are below the touch input.

21. The method of claim 20, further comprising assembling an image of an object initiating the touch input from the one or more signals received from the one or more light sensors below the touch input.

22. The method of claim 19, wherein the light sensing system is an ambient light detection system.

* * * * *